United States Patent
Schulze et al.

(10) Patent No.: US 9,627,517 B2
(45) Date of Patent: Apr. 18, 2017

(54) BIPOLAR SEMICONDUCTOR SWITCH AND A MANUFACTURING METHOD THEREFOR

(71) Applicant: Infineon Technologies AG, Neubiberg (DE)

(72) Inventors: Hans-Joachim Schulze, Taufkirchen (DE); Franz-Josef Niedernostheide, Münster (DE)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 13/761,213

(22) Filed: Feb. 7, 2013

(65) Prior Publication Data
US 2014/0217463 A1 Aug. 7, 2014

(51) Int. Cl.
*H01L 29/66* (2006.01)
*H01L 29/739* (2006.01)
(Continued)

(52) U.S. Cl.
CPC ........ *H01L 29/7393* (2013.01); *H01L 29/167* (2013.01); *H01L 29/32* (2013.01); *H01L 29/66333* (2013.01); *H01L 29/66348* (2013.01); *H01L 29/7397* (2013.01); *H01L 21/263* (2013.01); *H01L 29/0834* (2013.01); *H01L 29/41766* (2013.01); *H01L 29/42368* (2013.01)

(58) Field of Classification Search
CPC .............. H01L 21/223; H01L 21/2253; H01L 29/66333; H01L 29/00; H01L 29/66; H01L 29/739; H01L 29/7393; H01L 29/04; H01L 29/10; H01L 29/744; H01L 29/778

USPC ....... 257/139, 168, 197, 544, 552, 517, 351, 257/361, 362, 378, 393, 427, 477, 526, 257/539, 565, 163
See application file for complete search history.

(56) References Cited

U.S. PATENT DOCUMENTS 7,238,576 B2 * 7/2007 Yamaguchi ......... H01L 29/0634
257/342
7,283,576 B2 * 10/2007 Krupke ................ H01S 3/0943
372/55

(Continued)

FOREIGN PATENT DOCUMENTS

DE 19740906 C1 3/1999
DE 102004047749 A1 4/2006

(Continued)

*Primary Examiner* — Chuong A Luu
(74) *Attorney, Agent, or Firm* — Muphy, Bilak & Homiller, PLLC

(57) ABSTRACT

A bipolar semiconductor switch having a semiconductor body is provided. The semiconductor body includes a first p-type semiconductor region, a second p-type semiconductor region, and a first n-type semiconductor region forming a first pn-junction with the first p-type semiconductor region and a second pn-junction with the second p-type semiconductor region. On a shortest path through the first n-type semiconductor region between the first pn-junction and the second pn-junction a concentration of charge recombination centers and a concentration of n-dopants vary. The concentration of the charge recombination centers has a maximum at a point along the shortest path where the concentration of n-dopants is at least close to a maximum dopant concentration. Further, a manufacturing method for the bipolar semiconductor switch is provided.

16 Claims, 5 Drawing Sheets

(51) Int. Cl.
*H01L 29/32* (2006.01)
*H01L 29/167* (2006.01)
H01L 21/263 (2006.01)
H01L 29/417 (2006.01)
H01L 29/423 (2006.01)
H01L 29/08 (2006.01)

(56) References Cited

U.S. PATENT DOCUMENTS

| | | | |
|---|---|---|---|
| 7,485,920 B2 * | 2/2009 | Francis | H01L 21/221 257/131 |
| 7,491,629 B2 * | 2/2009 | Schulze | H01L 21/223 257/E21.145 |
| 7,880,200 B2 | 2/2011 | Hille et al. | |
| 2012/0267681 A1 * | 10/2012 | Nemoto | H01L 21/263 257/139 |
| 2014/0117502 A1 * | 5/2014 | Laven et al. | 257/607 |

FOREIGN PATENT DOCUMENTS

| | | |
|---|---|---|
| DE | 102007036147 A1 | 3/2009 |
| DE | 102009051317 A1 | 6/2011 |
| DE | 102012217562 A1 | 3/2013 |
| JP | H09121052 A | 5/1997 |
| JP | 2005197472 A | 7/2005 |
| WO | WO2011052787 A1 * | 5/2011 |

* cited by examiner

BIPOLAR SEMICONDUCTOR SWITCH AND A MANUFACTURING METHOD THEREFOR

TECHNICAL FIELD

Embodiments of the present invention relate to bipolar semiconductor switches, in particular to bipolar power semiconductor switches, and to related manufacturing methods.

BACKGROUND

Semiconductor devices such as thyristors and transistors, for example field-effect controlled switching devices such as a Metal Oxide Semiconductor Field-effect Transistor (MOSFET) or an Insulated Gate Bipolar Transistor (IGBT) have been used for various applications including but not limited to switches in power supplies and power converters, electric cars, air-conditioners, and even stereo systems. Particularly with regard to power devices capable of switching large currents and/or operating at higher voltages, low on-state resistance, which is subsequently referred to as on-resistance $R_{on}$, soft switching behavior (soft-recovery) and high voltage blocking capability are often desired. The softness of a semiconductor device may be described in terms of overvoltages and/or voltage oscillations and/or current oscillations occurring during switching-off the semiconductor device.

In an IGBT, an isolated gate FET (Field Effect Transistor) is used for control of a bipolar transistor. In so doing, the low on-resistance $R_{on}$ and the fast voltage control of the isolated gate FET is combined in a single semiconductor device with the high current and low saturation voltage VCEsat of the bipolar transistor. Accordingly, IGBTs are widely used in medium to high-power applications such as switching mode power supplies, inverters and traction motor controls. A single power IGBT may have a current switching capability of up to about 100 A or more and may withstand blocking voltages of up to 6 kV or even more.

When an IGBT is switched-off (turned-off), the current may retroact on the gate. This may result in oscillations and may even reduce the controllability. To improve the softness of IGBTs, the backside emitter efficiency may be laterally varied. This may however favor inhomogeneous current distributions.

Furthermore, deep vertical trench gates are often used for power IGBTs. In particular the bottom portion of the gate oxide may be exposed to high static electric fields, for example electric fields resulting from trapped charges in the gate oxide, and/or high dynamic electric fields in a blocking mode of the IGBT. This may result in reducing the blocking capability and even in a permanent device failure. Further, hot charge carriers formed in an avalanche event during the blocking mode may be injected into the gate oxide. This may result in shifting the operating points of the device and/or the location of the breakthrough. In particular, the so-called dynamic avalanche, in which—compared to the static case—the electric field gradient during the blocking mode gets substantially steeper due to flowing holes added to the background doping, may cause oscillations and/or device failure.

Known measures to reduce oscillations during switching-off IGBTs have only a limited effect and/or are accompanied by side-effects. For example, the bottom portion and/or side portions of the gate oxide may be made thicker. However, the thickness of the side portions of the gate oxide is typically limited to half of the trench width. Further, mechanical stress typically increases with the thickness of the gate oxide. Using so called high-k materials such as hafnium oxide having a larger dielectric constant than silicon oxide as gate oxide and gate dielectric, respectively, typically only result in a limited reduction of the oscillations and may result in a more complex manufacturing. Alternatively, additional trenches on source potential (inactive gate trenches) may be arranged between the trenches on gate potential. During switching-off, the hole current may flow below the additional trenches towards emitter contacts. Thus, the impact of the hole current on the gates may effectively be reduced. However, a gate resistance, which is too high for many applications, may be required to influence the switching-off. Further, this design typically uses a large device area.

SUMMARY

According to an embodiment of a bipolar semiconductor switch, the semiconductor switch includes a semiconductor body including a first p-type semiconductor region, a second p-type semiconductor region, and a first n-type semiconductor region forming a first pn-junction with the first p-type semiconductor region and a second pn-junction with the second p-type semiconductor region. On a shortest path through the first n-type semiconductor region between the first pn-junction and the second pn-junction, a concentration of charge recombination centers and a concentration of n-dopants vary. The concentration of the charge recombination centers has a maximum at a point along the shortest path where the concentration of n-dopants is at least close to a maximum dopant concentration.

According to an embodiment of a bipolar semiconductor switch, the semiconductor switch includes a semiconductor body of a semiconductor material. The semiconductor body includes a first p-type semiconductor region, a second p-type semiconductor region, and a first n-type semiconductor region forming a first pn-junction with the first p-type semiconductor region and a second pn-junction with the second p-type semiconductor region. In a vertical cross-section, which is substantially orthogonal to at least one of the first pn-junction and the second pn-junction, a breakdown charge of the semiconductor material divided by the elementary charge is larger than an integral obtained by integrating a concentration of n-dopants along a substantially vertical line between the first pn-junction and a point in the first n-type semiconductor region where a charge carrier life-time in the first n-type semiconductor region is at least close to a minimum value.

According to an embodiment of a bipolar semiconductor switch, the semiconductor switch includes a semiconductor body. The semiconductor body includes a first p-type semiconductor region, a second p-type semiconductor region, and a first n-type semiconductor region forming a first pn-junction with the first p-type semiconductor region and a second pn-junction with the second p-type semiconductor region. On a shortest path through the first n-type semiconductor region between the first pn-junction and the second pn-junction, a concentration of n-dopants has at least two maxima and a charge carrier life-time has a minimum which is located at least close to at least one of the at least two maxima.

According to an embodiment of a method for forming a bipolar semiconductor switch, the method includes: providing a semiconductor body having a main surface, a back surface arranged opposite, and a first semiconductor layer; and reducing a charge carrier life-time. Reducing the charge carrier life-time includes at least one of indiffusing heavy metals into the first semiconductor layer, implanting protons into the first semiconductor layer, and implanting helium nuclei into the first semiconductor layer. The method is performed so that the charge carrier life-time has, in a vertical direction which is substantially orthogonal to the main surface, a minimum in a lower n-type portion of the first semiconductor layer where a concentration of n-type dopants is at least close to a maximum.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
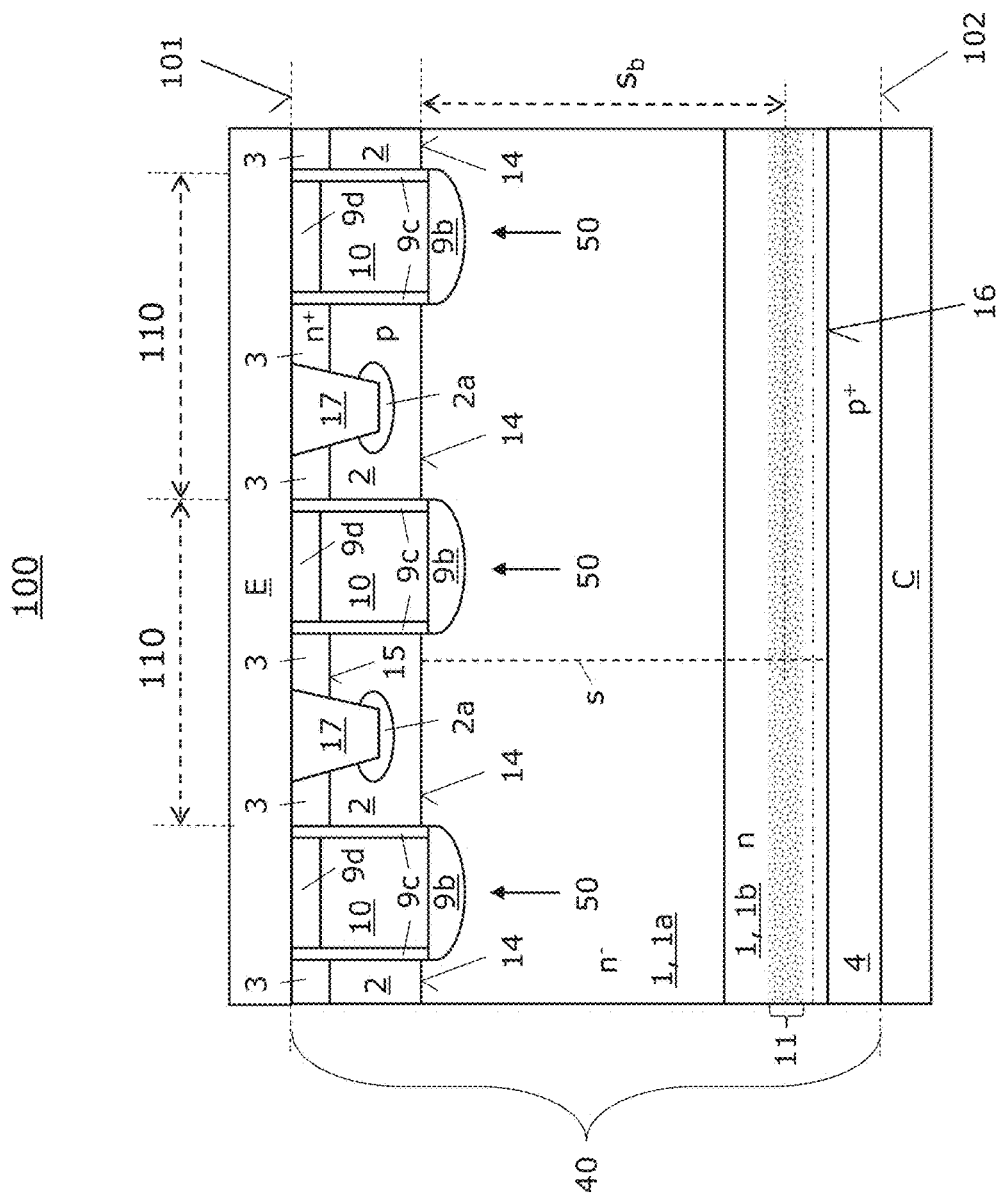
FIG. 1 illustrates a vertical cross-section through a bipolar semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

Specific embodiments described in this specification pertain to, without being limited thereto, to bipolar semiconductor devices that may be operated as switches, in particular bipolar power semiconductor devices and manufacturing methods therefor. The semiconductor device is typically a vertical semiconductor device such as a vertical thyristor or a vertical IGBT or a vertical bipolar transistor with a first load electrode arranged on the first surface and a second load electrode arranged on the second surface. The first and second load electrodes may be formed as respective metallizations. Typically, the formed semiconductor device is a power semiconductor device having an active area with a plurality of cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and higher. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between an emitter region of the first conductivity type and a drift region of the first conductivity type. In the following, the drift region is also referred to as base region. The drift region may be in contact with a collector region. The drain region or the collector region is in low resistive electric contact with a drain or collector electrode. The source region or emitter region is in low ohmic electric contact with a source or emitter electrode. In the context of the present specification, the terms "in ohmic contact" and "in resistive electric contact" intend to describe that there is an ohmic current path, typically a low-ohmic ohmic current path, between respective elements or portions of a semiconductor device when no voltages are applied to and/or across the semiconductor device. Within this specification the terms "in low resistive electric contact", "electrically coupled", and "in low resistive electric connection" are used synonymously.

In the context of the present specification, the term "gate electrode" intends to describe an electrode which is situated next to, and insulated from the body region and configured to form and/or control a channel region through the body region.

The term "commutating" as used in this specification intends to describe the switching of the current of a semiconductor device from the forward direction or conducting direction in which a pn-load junction, for example the pn-junction between the body region and the drift region of an IGBT or MOSFET, is forwardly biased to the opposite direction or reverse direction in which the pn-load junction is reversely biased.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. For power semiconductor applications currently mainly Si, SiC (silicon carbide), GaAs (silicon arsenide) and GaN (gallium nitride) materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance $R_{on}$.

FIG. 1 illustrates a vertical cross-section through a bipolar semiconductor device 100. The bipolar semiconductor device 100 includes a semiconductor body 40 which extends between a main surface 101 with a normal direction defining a vertical direction and a back surface 102 which is arranged opposite to the main surface 101. In the following, the main surface 101 is also referred to as main horizontal surface. The semiconductor body 40 includes a first n-type semiconductor region 1, at least one body region 2, which is in the following also referred to as first p-type semiconductor region 2 and at least one p-type collector region 4, which is in the following also referred to as second p-type semiconductor region 4. The first n-type semiconductor region 1 forms a first pn-junction 14 with the body region(s) 2 and a second pn-junction 16 with the collector region 4. In the following, the second pn-junction 16 and the first pn-junction 14 are also referred to as pn-junction 16 and further pn-junction 14, respectively. The semiconductor body 40 further includes one or more n-type emitter regions 3 which forms a third pn-junction 15 with the body region(s) 2 and may extend to the main surface 101.

In the exemplary embodiment, three vertical trenches 50 extend from the main surface 101, along respective emitter or source regions 3 and body regions 2 and partly into the first n-type semiconductor region 1. This is, however, only an example. Typically, the semiconductor device 100 is a power semiconductor device which includes in an active area a plurality of vertical trenches 50. In the vertical cross-section and typically also when seen from above, the vertical trenches 50 typically form in the active area a lattice defining unit cells 110.

In each vertical trench 50, a gate electrode 10 is arranged and separated from the semiconductor body 40 by a dielectric region 9b, 9c, 9d. A lower portion 9b of the dielectric region is arranged below the gate electrode 10 and between the gate electrode 10 and the first n-type semiconductor region 1. Gate dielectric portions 9c of the dielectric region are arranged at sidewalls of the vertical trench 50. The gate dielectric portions 9c extend from the main surface 101, along a respective source region 3, a respective adjoining body region 2 and partly into the first n-type semiconductor region 1. The gate electrode 10 is covered by an upper dielectric portion 9d. The lower dielectric portion 9b, the upper dielectric region 9d and the gate dielectric portions 9c may be made of the same dielectric material, for example silicon oxide ($SiO_2$).

An emitter metallization in low ohmic connection with the emitter or source region(s) 3 and the body region(s) 2 via a respective higher doped p-type body contact region 2a may be arranged on the main surface 101 to form an emitter or source terminal E.

Note that the contact plugs 17 and the body contact regions 2a may also only be formed in certain vertical cross-section, for example in vertical cross-section of the semiconductor device 100 without the vertical trenches 50. This allows closer vertical trenches 50.

Further, a gate metallization (not shown FIG. 1) in low ohmic connection with the gate electrodes 10 may be arranged on the main surface 101 to form a gate terminal G.

To form a collector terminal C, a collector metallization maybe arranged opposite to the emitter metallization, i.e. on the back surface 102, and in low ohmic connection with the collector region 4.

In a forward mode, a channel region may be formed in the body region(s) 2 between the emitter region(s) 3 and the first n-type semiconductor region 1 by applying an appropriate voltage difference between the gate terminal G and the emitter terminal E. Accordingly, the semiconductor device 100 may be operated as an IGBT.

During a blocking mode, in which the pn-junction 14 is reversely biased, and depending on the voltage $V_{CE}$ between the collector terminal C and the emitter terminal E, a space charge region extends into first n-type semiconductor region 1 and to a lesser extent into the higher doped body region(s) 2.

Typically, the first n-type semiconductor region 1 includes an n-type drift region 1a and a so-called n-type field-stop region 1b which is formed underneath the drift region 1a and between the drift region 1a and the collector region 4, and has a higher maximum doping concentration and/or a higher mean doping concentration than the drift region 1a to restrict the spatial extension of the electrical field during the blocking mode. In the following, the drift region 1a and the field-stop region 1b are also referred to as first or upper portion 1a of the first n-type semiconductor region 1 and as second or lower portion 1b of the first n-type semiconductor region 1, respectively. Typically, the maximum doping concentration of the field-stop region 1b is at least about one order of magnitude higher than the maximum doping concentration of the drift region 1a. The maximum extension of the space charge region during the blocking mode without avalanche is illustrated in FIG. 1 by the dashed-dotted line (static case).

During an avalanche breakdown, charge carriers generated in the first n-type semiconductor region 1 close to the trenches 50 flow along the trench-substrate interface either towards the body region(s) 2 and then to the body contact region(s) 2a or towards the collector region 4 depending on their conductivity type. During this flow, the charge carriers may be scattered into the adjacent dielectric regions 9b, 9c, 9d and become trapped and accumulated there. The trapped charge carriers can cause a drift of the electrical properties of the device which could lead to a changed behavior and eventually to a malfunction of the device as explained above.

During a dynamic avalanche event, which may be due to a current filamentation or cosmic radiation, the space charge region may partly retreat into the first n-type semiconductor region 1, typically the field-stop region 1b, to form a dynamic space charge region.

According to an embodiment, a concentration of charge recombination centers is increased in a transition region 11 of the first n-type semiconductor region 1. The transition region 11 lies within the static space charge region but outside the dynamic space charge region, for example within the field-stop region 1b. Accordingly, the transition region 11 may provide charge generating centers during switching-off and commutating, respectively, and may reduce the charge carrier life-time during a dynamic avalanche event. Thus, the injection of holes from the backside during the dynamic avalanche may be reduced. The dynamic avalanche may even be stopped. Accordingly, oscillations during commutating may at least substantially be reduced and thus the softness improved. Furthermore, other device parameters such as long-term stability may be improved, in particular for trench-IGBTs, since the dynamic avalanche below the trench bottom, i.e. below the lower dielectric portions 9b may be suppressed or at least substantially reduced. Thus, the risk of entrapping hot charge carriers in the lower dielectric portions 9b, which may result in shifting of device parameters such as starting voltages and locations of avalanche onset, may be reduced. Note that such a transition region may be used for punch-trough IGBTs and non-punch-trough IGBTs and also for lateral IGBTs, thyristors and bipolar transistors.

The charge recombination centers may be heavy metal atoms such as platinum (Pt) atoms, and/or lattice defect, for example so-called A-centers or lattice vacancies such as double vacancies also called $V_2$-centers, that may be produced by implanting high energetic particles such as electrons, protons or helium nuclei and subsequent annealing process.

On a shortest path s through the first n-type semiconductor region 1 between the first pn-junction 14 and the second pn-junction 16 a concentration of charge recombination centers and a concentration of n-dopants vary (the concentration of n-dopants is typically higher in the field-stop region 1b).

According to an embodiment, the first n-type semiconductor region 1, in particular the field-stop region 1b, includes protons as donors (n-type dopants). This may facilitate manufacturing, in particular when the charge recombination centers are formed by implanting high energetic protons and subsequent annealing.

According to an embodiment, on the shortest path s the concentration of the charge recombination centers has a maximum concentration at a point $s_b$ corresponding to a vertical depth where the concentration of n-dopants is at least close to a maximum dopant concentration (in the field-stop portion). The maximum concentration of the charge recombination centers may be in a range from about $10^{11}$ cm$^{-3}$ to about $10^{13}$ cm$^{-3}$.

In the exemplary embodiment, the semiconductor device 100 is a vertical IGBT with substantially horizontally orientated first and second pn-junctions 14, 16 which are substantially parallel to each other. Thus the shortest path s corresponds to a substantially vertical line through the first n-type semiconductor region 1.

Typically, a breakdown charge of the semiconductor material divided by the elementary charge substantially matches an integral obtained by integrating a concentration of n-dopants along the vertical line s between the first pn-junction 14 and the end of the space charge region in the first n-type semiconductor region 1, the n-doped drift region 1a or the n-doped field-stop region 1b, when the full breakdown voltage (rated static breakdown voltage) is applied between the collector metallization (C) and the emitter metallization (E). In FIG. 1, the end of the space charge region is represented by the dashed-dotted line. For example, the breakdown charge of silicon divided by the elementary charge is about $2*10^{12}$ cm$^{-2}$.

According to an embodiment, a line integral L of a concentration of n-dopants along the vertical line s (shortest path) and integrated between the first pn-junction 14 and the point $s_b$ where the concentration of the charge recombination centers has or is at least close to a maximum concentration and where the charge carrier life-time has or is at least close to a minimum, respectively, is smaller than the breakdown charge divided by the elementary charge. Typically, the line integral L is in a range from about 60% to about 90% of the breakdown charge divided by the elementary charge, more typically in a range from about 70% to about 85% of the breakdown charge divided by the elementary charge. For example, the line integral L may be about 75% of the breakdown charge divided by the elementary charge. This may also depend on the operating conditions of the semiconductor device. For example, the point $s_b$ may correspond to the end of the space charge region in the first n-type semiconductor region 1, the n-doped drift region 1a or the n-doped field-stop region 1b, when an intermediate circuit voltage of a circuitry in which the semiconductor device is to be operated is applied between the collector metallization (C) and the emitter metallization (E). The intermediate circuit voltage may for example correspond to about 75% of the rated breakdown voltage.

Figure 2:
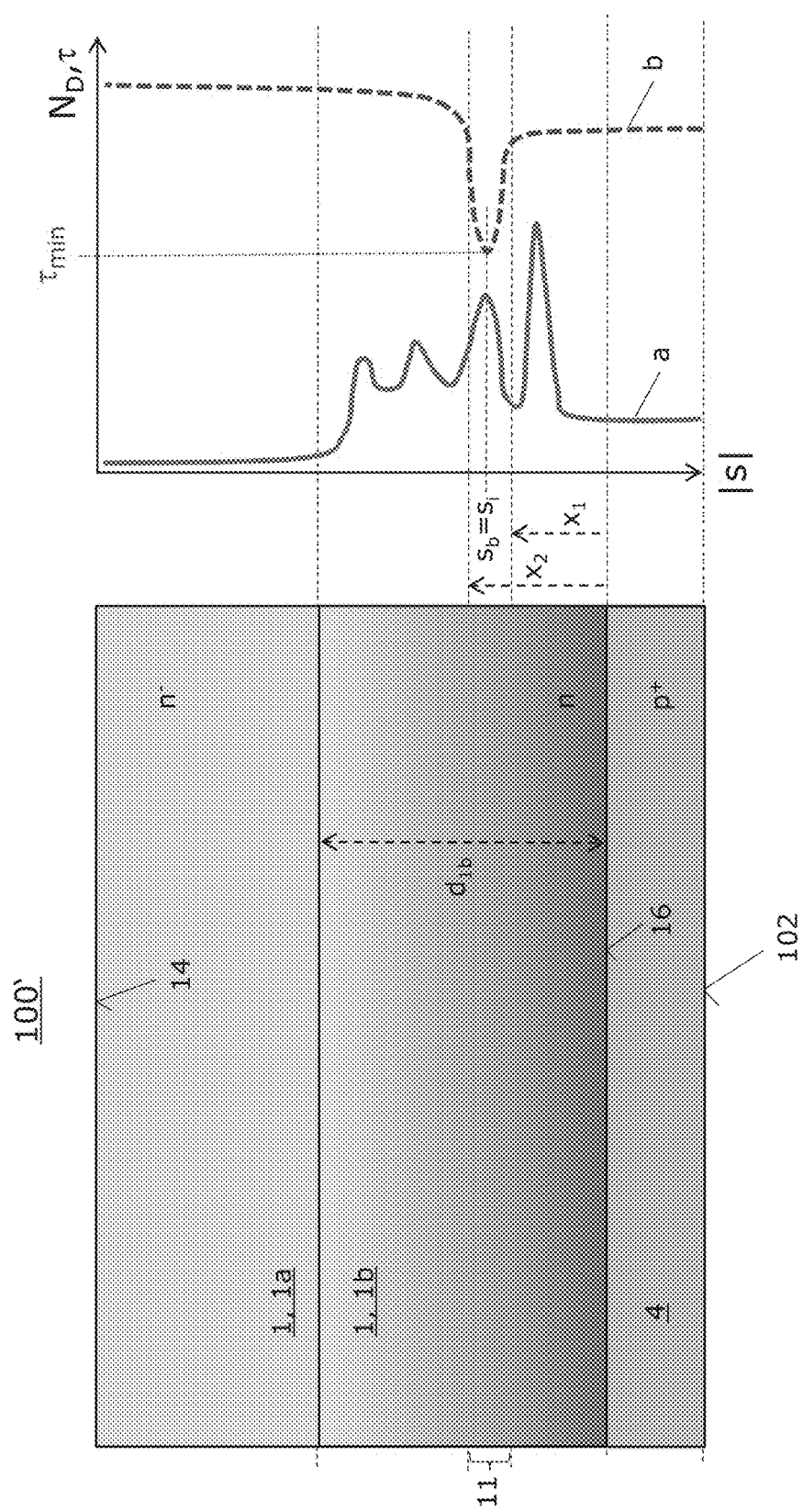
FIG. 2 illustrates a vertical cross-section through a semiconductor body of a bipolar semiconductor device, a charge carrier life-time and a doping concentration according to embodiments.

FIG. 2 illustrates, on the left side, a lower section of a vertical cross-section through a semiconductor body of a bipolar semiconductor device 100'. The semiconductor device 100' is similar to the semiconductor device 100 explained above with regard to FIG. 1. The illustrated lower section may even correspond to a corresponding lower section of FIG. 1. For sake of clarity, only the first n-type semiconductor region 1 and the collector region 4 are shown. On the right side a vertical distribution of a charge carrier life-time τ and a vertical doping concentration of n-type dopants $N_D$ are illustrated as function of a distance |s| from the first pn-junction 14.

In the exemplary embodiment illustrated in FIG. 2, the concentration of n-dopants has, in a vertical direction, in the field-stop region 1b four maxima while the charge carrier life-time has a minimum in the field-stop region 1b. Note that the charge carrier life-time is inversely related to a concentration of the charge recombination centers which has, in the vertical direction, a maximum where the charge carrier life-time has its minimum. Note that the concentration of n-type dopants $N_D$ in vertical direction and on a shortest path between the first and second pn-junctions 14, 16, respectively, may have also have more or less than four maxima.

In the exemplary embodiment illustrated in FIG. 2, the concentration of the charge recombination centers has in the vertical direction a maximum (and the charge carrier life-time a minimum $\tau_{min}$) in a depth $s_b$ where the concentration of n-dopants $N_D$ has or is close to a maximum dopant concentration. In this embodiment, the concentration of n-dopants $N_D$ on a shortest path s through the first n-type semiconductor region 1 and between the first pn-junction 14 and the second pn-junction 16 has typically a maximum at a point $s_i$ which substantially corresponds to the point $s_b$ where the concentration of the charge recombination centers has a maximum.

According to numerical simulations, a particular advantageous device performance with regard to softness and robustness is obtained when the concentration of the charge recombination centers has, in the vertical direction, its maximum where the concentration of n-dopants $N_D$ substantially reaches a local maximum, in particular the second or third maximum counted from the second pn-junction 16. Among others, this may depend on the doping profiles and the vertical distance between the first pn-junction 14 and the second pn-junction 16. For example, the concentration of the charge recombination centers may have, in the vertical direction, its maximum where the concentration of n-dopants $N_D$ substantially reaches a fourth (local) maximum counted from the second pn-junction 16 or in the drift region 1a.

Typically, the field-stop region 1b has a vertical extension $d_{1b}$ and the charge carrier life-time $\tau$ as function of a vertical distance x from the second pn-junction 16 is lower in a range $[x_1, x_2]$ between a first value $x_1$, which corresponds to about 10% of the vertical extension $d_{1b}$, more typically to about 20% of the vertical extension $d_{1b}$, and second value $x_2$ which corresponds to about 80% of the vertical extension $d_{1b}$, more typically to about 60% of the vertical extension $d_{1b}$, than outside the range. For high-voltage switches, the vertical extension $d_{1b}$ may be in a range from about 10 µm to about 50 µm or even larger while the vertical extension of the drift region may be in a range from about 400 µm to about 600 µm or even larger.

Figure 3:
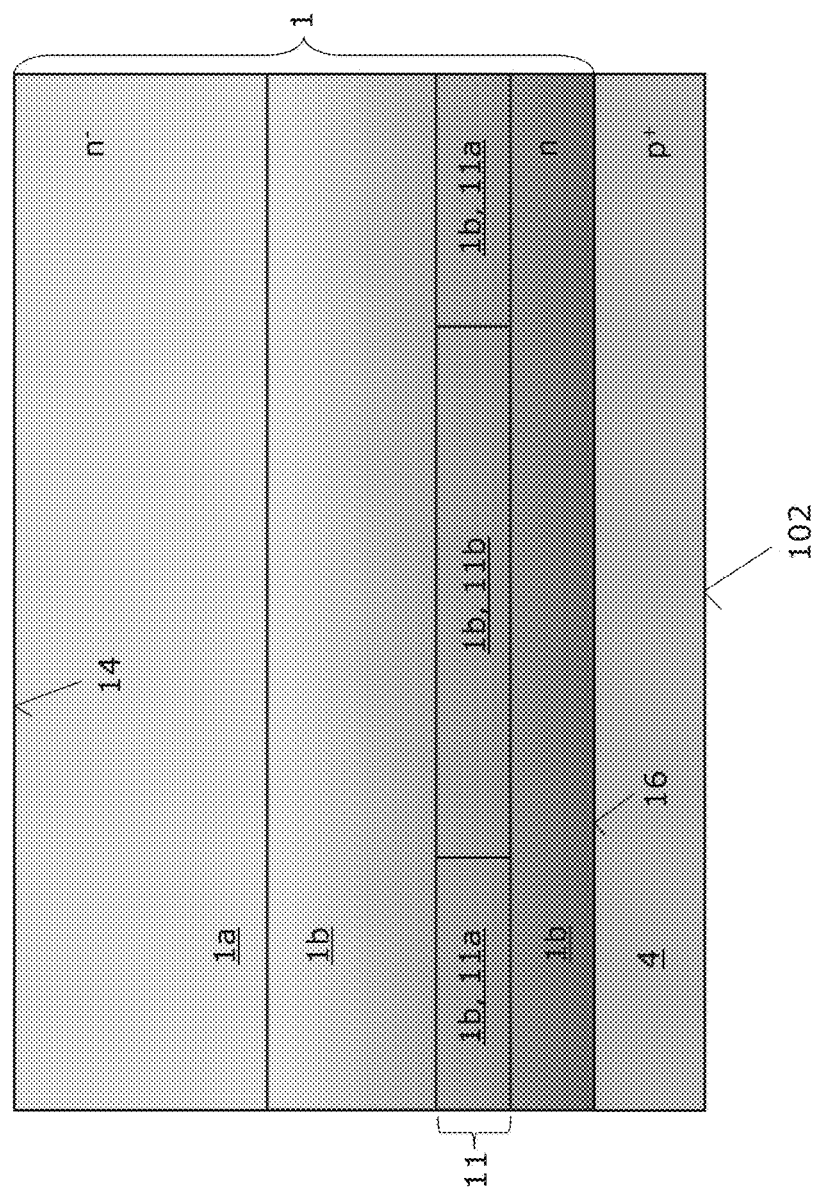
FIG. 3 illustrates a vertical cross-section through a semiconductor body of a bipolar semiconductor device according to embodiments.

FIG. 3 illustrates a lower section of a vertical cross-section through a bipolar semiconductor device 200. The bipolar semiconductor device 200 is similar to the semiconductor device 100, 100' explained above with regard to FIGS. 1, 2 and may also be operated as a switch. However, the concentration of charge recombination centers not only varies in vertical direction but also in a horizontal direction, i.e. in a direction which is substantially parallel to the second pn-junction, in the field-stop region 1.

In the exemplary embodiment, the transition region 11 includes, in the vertical cross-section, zones 11a and 11b of different maximum concentration of charge recombination centers and/or of different mean concentration of charge recombination centers. Note that the maximum concentration of charge recombination centers may substantially be zero in one of the zones 11a and 11b. Due to the laterally varying concentration of charge recombination centers, i.e. due to the in a horizontal direction varying concentration of charge recombination centers, the softness of the IGBT 200 during commutating may be improved. By appropriately varying the concentration of charge recombination centers and the charge carrier life-time, respectively, in vertical and horizontal directions, a sufficiently good softness may be obtained even without lateral varying the emitter efficiency of the second pn-junction 16. Accordingly, manufacturing of semiconductor device 200 may be facilitated compared to semiconductor devices of same softness but with a lateral varying the back-side emitter efficiency.

This applies also to other embodiments, in which the transition region 11 includes, in the vertical cross-section, spaced apart zones which are located at substantially the same vertical depth and have a higher maximum concentration of charge recombination centers and/or a higher mean concentration of charge recombination centers than the remainder of the field-stop region 1b.

Figure 4:
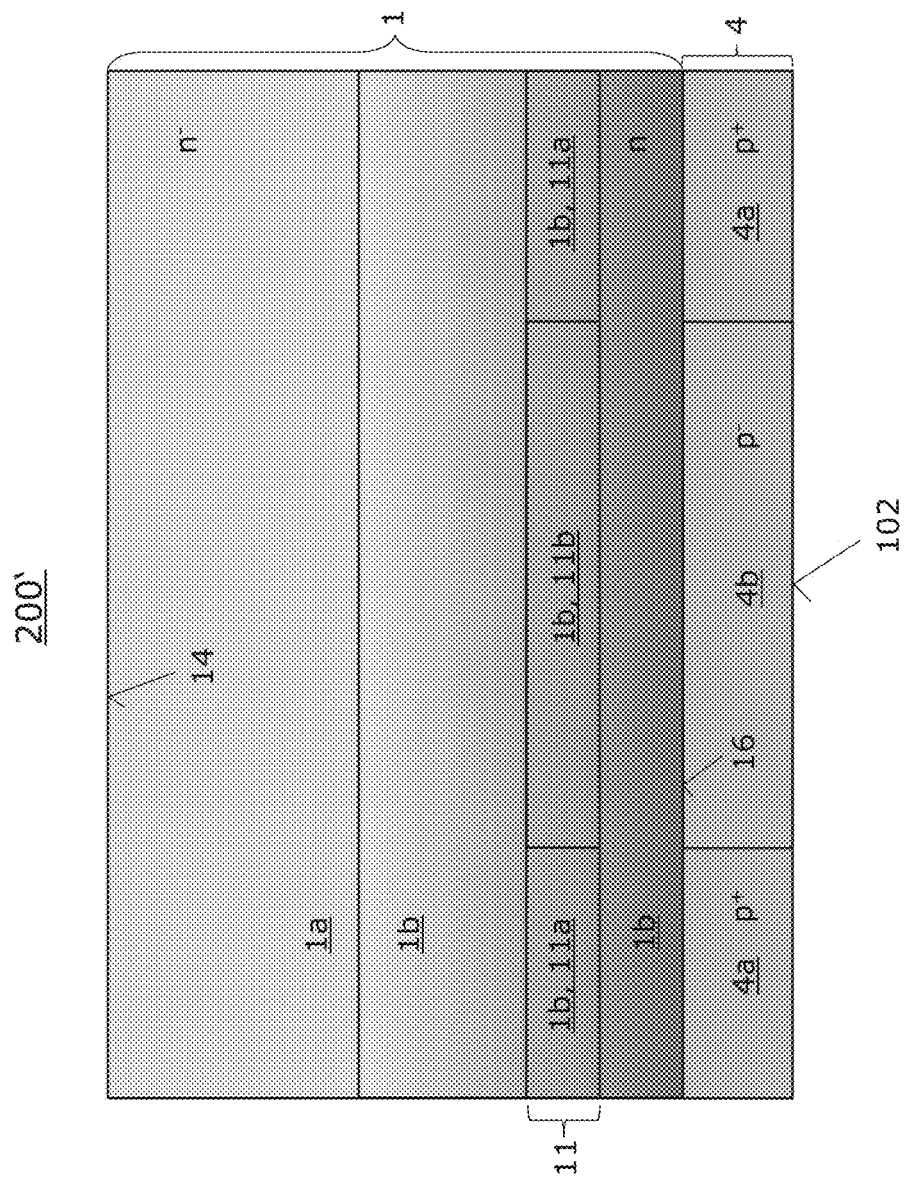
FIG. 4 illustrates a vertical cross-section through a semiconductor body of a bipolar semiconductor device according to embodiments.

FIG. 4 illustrates a lower section of a vertical cross-section through a semiconductor body of a bipolar semiconductor device 200'. The bipolar semiconductor device 200' is similar to the semiconductor device 200 explained above with regard to FIG. 3 and may also be operated as a bipolar switch, for example as an IGBT. However, the emitter efficiency of the second pn-junction 16 of the semiconductor device 200' is laterally varied, i.e. varied in a direction which is substantially parallel to the second pn-junction 16, to further improve the softness.

In the exemplary embodiment, the semiconductor device 200' has a horizontally structured collector region 4 having a first collector portion 4b with a first doping concentration and two adjacent second collector portions 4a with a higher doping concentration than the first doping concentration. Note that the drawing of FIG. 4 may only correspond to a section and that the semiconductor device 200' may include a plurality of first and second collector portions 4b, 4a.

Due to the structured collector region 4 of the semiconductor device 200', the gain $\alpha_{pnp}$ of the pnp-transistor formed by the first p-type semiconductor region (body region, not shown in FIG. 4), the first n-type semiconductor region 1 and the second p-type semiconductor region 4 is horizontally varied. This may be used to further improve the softness of the semiconductor device 200' during commutating. Note that n-channel-IGBTs may be considered as a Darlington configuration of an n-channel field effect transistor (FET) and a pnp-transistor.

Alternatively or in addition to laterally varying the concentration of p-dopants of the collector region 4, a concentration of n-dopants of the field-stop region 1b in a layer or portion next to the second pn-junction 16 may be varied in a direction which is substantially parallel to the second pn-junction 16 to laterally vary the backside emitter efficiency.

Typically, the zone(s) 11b are arranged vertically above the first collector portion 4b, i.e. completely overlap with the first collector portion 4b in a projection onto the second pn-junction 16 and when seen form above, respectively, and have a lower maximum concentration of charge recombination centers and/or of a lower mean concentration of charge recombination centers compared to the zones 11a arranged vertically above the second collector portions 4a. The zone(s) 11b may even be omitted.

In other words, the minimum charge carrier life-time is typically lower above the second collector portions 4a compared to zones of the field-stop regions 1b which are arranged vertically above the first collector portions 4b.

In another embodiment, a collector region 4 with laterally varying concentration of p-dopants is combined with field-stop region 1b in which the concentration of charge recombination centers substantially varies, at least in an active area, only in the vertical direction.

Figure 5:
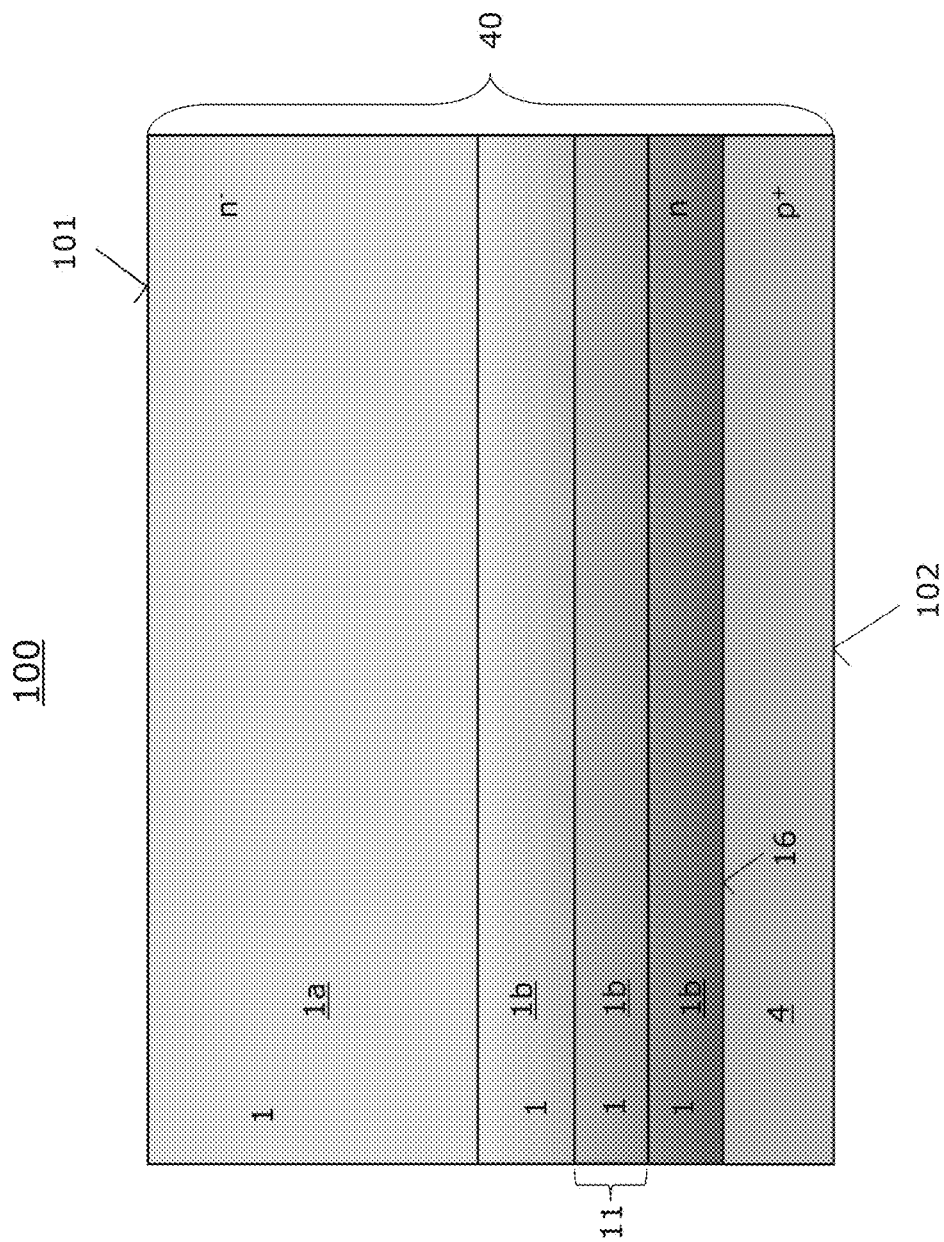
FIG. 5 illustrates a vertical cross-section through a semiconductor body during method steps of a method according to embodiments.

FIG. 5 illustrates a vertical cross-section through a semiconductor body during method steps of a method for manufacturing a semiconductor device 100. In a first process, a semiconductor body 40, for example a wafer or substrate, having a main surface 101 and a back surface 102 opposite the first surface 101 is provided. The normal direction of the main surface 101 is substantially parallel to the vertical direction.

As illustrated in FIG. 5, the semiconductor body 40 typically includes a first n-type semiconductor layer 1 having a first maximum doping concentration.

In the exemplary embodiment, the semiconductor body 40 is provided with a first n-type semiconductor layer 1 which extends between the main surface 101 and a pn-junction 16. The pn-junction 16 is typically substantially parallel to the man surface 101 and formed between the first n-type semiconductor layer 1 and a p-type layer 4 which extends to the back surface 102. Typically, the p-type layer 4 forms a collector region in the semiconductor device to be manufactured. A concentration of p-type dopants may laterally vary as explained above ith regard to FIG. 4.

In another embodiment, the pn-junction 16 is formed with the first semiconductor layer 1 by deposition or by implantation and subsequent annealing.

In a further process, a charge carrier life-time of the first n-type semiconductor layer 1 is reduced so that the charge carrier life-time has, in the vertical direction, a minimum in a lower n-type portion 1b of the first n-type semiconductor layer 1 where a concentration of n-type dopants is at least close to a maximum in the vertical direction, typically where the concentration of n-type dopants has a maximum in the vertical direction, more typically a local maximum. In the semiconductor device 100 to be manufactured, the lower n-type portion 1b and an upper n-type portion 1a may form a field-stop region and a drift region, respectively.

As explained above with regard to FIGS. 1 to 3, the concentration of n-type dopants has, in the vertical direction, the maximum typically in a transition region 11.

Reducing the charge carrier life-time may include indiffusing heavy metals such as Pt into the first semiconductor layer 1, for example from the back surface 102, and/or implanting of high energetic particles such as electrons, protons and helium nuclei. Indiffusing heavy metals and/or implanting of high energetic particles may be done through a respective mask. Furthermore, indiffusing heavy metals and implanting of high energetic particles may be combined, in particular for thicker substrates with a vertical extension of for example 400 µm, 600 µm or more.

Implanting high energetic particles for reducing the charge carrier life-time typically includes irradiating at least one of the main surface 101 and the back surface 102 with about $10^{11}$ protons per cm$^2$ to about $10^{12}$ protons per cm$^2$; more typically with about $2*10^{11}$ protons per cm$^2$ to about $5*10^{11}$ protons per cm$^2$, and/or with about $10^{10}$ helium nuclei per cm$^2$ to about $10^{11}$ helium nuclei per cm$^2$, more typically with about $2*10^{10}$ helium nuclei per cm$^2$ to about $5*10^{10}$ helium nuclei per cm$^2$. The penetration depth of the high energetic particles is adjusted by the particle energy.

Typically, several implanting steps with different particle energies are performed to produce a vertical distribution of n-type dopants as explained above with regard to FIG. 2. For the purpose, the proton implantation dose is typically in a range between about $10^{12}$ protons per cm$^2$ to about $3 \times 10^{14}$ protons per cm$^2$.

Due to implanting high energetic particles, defects are formed in the first n-type semiconductor layer 1, in particular in the end-of range region of the used particle beam in the first n-type semiconductor layer 1.

To stabilize the defects, a thermal annealing process is typically performed so that the defects may operate as charge-recombination centers in the semiconductor device to be manufactured. The thermal annealing may be performed in a temperature range from about 220° C. to about 350° C. when silicon is used as semiconductor material of the semiconductor body 40. Note that the defects (A-centers and/or lattice defects) are stabilized but not healed in this temperature range. For example, the thermal annealing may be performed at a temperature of about 300° C. or about 340° C. At about 300° C. both A-centers and lattice defects are stabilized whereas at about 340° C. mainly only A-centers are stabilized.

Note further that implanting of protons and subsequent thermal annealing also increases the n-type doping even when the thermal annealing is performed in a temperature range from about 220° C. to about 350° C. At higher temperatures, for example at about 400° C. or higher, the lattice defects are healed while the protons remain as active n-dopants. Therefore, implanting of protons and subsequent thermal annealing at a temperature of at least about 400° C. may be used to increase the n-doping of the first n-type semiconductor layer 1, in particular its lower n-type portion 1b, prior to additional implanting of protons and subsequent thermal annealing in a temperature range from about 220° C. to about 350° C. to further increases the n-type doping and to stabilize charge-recombination centers so that, on a vertical line through the first n-type semiconductor layer 1, the concentration of n-type dopants is at least close to a maximum where the concentration of n-type dopants has a maximum, typically a local maximum, which is more typically the second or third maximum counted from the pn-junction 16 as explained above with regard to FIG. 2.

For example, after (k−1) implantations of protons with different energies and subsequent thermal annealing at a temperature of at least about 400° C., one further process of implanting proton with an energy which is different to the previously used proton beam energies and a subsequent thermal annealing in a temperature range from about 220° C. to about 350° C. may be used. With appropriate beam energies, a vertical variation of n-type doping and charge carrier life-time as explained above with regard to FIG. 2 may efficiently be achieved (the vertical variation illustrate in the right drawing in FIG. 2 may be obtained with four proton implantations, i.e. k=4).

When a helium irradiation is used, typically from the backside, for reducing the charge carrier life-time, the helium beam energy is typically set such that its end-of-range coincides with a proton-induced donator peak to prevent forming an undesired pn-junction in the field-stop region.

To achieve a lateral variation of the charge carrier life-time and charge recombination centers, respectively, as explained above with regard to FIGS. 3, 4, the high energetic particles may be implanted through an implanting mask, for example a resist mask or a SiO$_2$-mask. The implanting mask may be arranged on the main surface 101 or the back surface 102 prior to implanting. Note that protons may be implanted from the main surface 101 or the back surface 102, while helium nuclei are typically implanted from the back surface 102. If a semiconductor device as illustrated in FIG. 4 is to be manufactured, the implanting mask typically corresponds to the layout of the collector portion(s) 4b so that less or none protons (and/or helium nuclei) are implanted into portion(s) 11b of the first semiconductor layer 1 which is (are) arranged above the collector portion(s) 4b of a structured p-type layer 4.

According to an embodiment, a further pn-junction (not shown in FIG. 5) is formed in or at the first semiconductor layer 1, which is substantially parallel the pn-junction 16 so that on a shortest path through the first n-type semiconductor layer 1, i.e. on a substantially vertical line, between the pn-junction 16 and the further pn-junction a concentration of charge recombination centers comprises a maximum at a point $s_b$ where a concentration of n-dopants is at least close to a maximum dopant concentration.

Typically, a line integral L of the n-dopant concentration, which is obtained by integrating along the shortest path and between the further pn-junction and the point $s_b$ where the concentration of the charge recombination centers has or is at least close to a maximum concentration and where the charge carrier life-time has or is at least close to a minimum, respectively, is substantially smaller than, more typically in a range from about 60% to about 90% of, the breakdown charge of the semiconductor material of the semiconductor body divided by the elementary charge.

Typically, at least one insulated gate electrode is formed next to the further pn-junction. This may include etching at least one vertical trench through the further pn-junction, insulating at least a sidewall and a bottom wall of the at least one vertical trench, and at least partly filling the at least one vertical trench with a conducting material. Note that all processes requiring higher temperatures than about 350° such as forming a thermal oxide to insulate the sidewalls and/or the bottom wall of the at least one vertical trench are to be performed prior to implanting protons for reducing the charge carrier life-time.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A bipolar semiconductor switch, comprising a semiconductor body comprising:
   a first p-type semiconductor region;
   a second p-type semiconductor region; and
   a first n-type semiconductor region forming a first pn-junction with the first p-type semiconductor region and a second pn-junction with the second p-type semiconductor region;
   wherein, on a shortest path through the first n-type semiconductor region between the first pn-junction and the second pn-junction, a concentration of charge recombination centers and a concentration of n-dopants vary, such that the concentration of the charge recombination centers is at a maximum at a point along the shortest path where the concentration of n-dopants is at or close to a locally maximum dopant concentration,
   wherein the locally maximum dopant concentration is one of at least two local maxima of the concentration of n-dopants on the shortest path.

2. The bipolar semiconductor switch of claim 1, wherein the concentration of n-dopants at the point substantially matches the maximum dopant concentration.

3. The bipolar semiconductor switch of claim 1, wherein the first n-type semiconductor region comprises a semiconductor material having a breakdown charge, and wherein a line integral of a concentration of n-dopants along the shortest path and integrated between the first pn-junction and the point is smaller than the breakdown charge divided by the elementary charge.

4. The bipolar semiconductor switch of claim 1, wherein the first n-type semiconductor region comprises a semiconductor material having a breakdown charge, and wherein a line integral of a concentration of n-dopants along the shortest path and integrated between the first pn-junction and the point is in a range from about 60% to about 90% of the breakdown charge divided by the elementary charge.

5. The bipolar semiconductor switch of claim 1, wherein the first pn-junction and the second pn-junction are substantially parallel.

6. The bipolar semiconductor switch of claim 1, wherein at least one of the concentration of charge recombination centers, a concentration of p-dopants of the second p-type semiconductor region and a concentration of n-dopants of the first n-type semiconductor region varies in a direction which is substantially parallel to the second pn-junction.

7. The bipolar semiconductor switch of claim 1, wherein the first n-type semiconductor region comprises a first portion which adjoins the first p-type semiconductor region, wherein the first n-type semiconductor region comprises a second portion which adjoins the second p-type semiconductor region and comprises at least one of a higher maximum doping concentration than the first portion, a higher mean concentration of the charge recombination centers than the first portion and a lower maximum charge carrier life-time than the first portion.

8. The bipolar semiconductor switch of claim 7, wherein the first portion has, in a vertical direction which is substantially orthogonal to the second pn-junction a vertical extension, wherein the charge carrier life-time as function of a vertical distance from the second pn-junction is lower in a range between a first value which corresponds to about 10% of the vertical extension and second value which corresponds to about 80% of the vertical extension than outside the range.

9. The bipolar semiconductor switch of claim 1, wherein the first n-type semiconductor region comprises protons as donors.

10. The bipolar semiconductor switch of claim 1, wherein the bipolar semiconductor switch is selected form a group consisting of an IGBT, a thyristor and a bipolar transistor.

11. A bipolar semiconductor switch, comprising a semiconductor body of a semiconductor material, the semiconductor body comprising:
   a first p-type semiconductor region;
   a second p-type semiconductor region;

a first n-type semiconductor region forming a first pn-junction with the first p-type semiconductor region and a second pn-junction with the second p-type semiconductor region, wherein, in a vertical cross-section which is substantially orthogonal to at least one of the first pn-junction and the second pn-junction, a breakdown charge of the semiconductor material divided by the elementary charge is larger than an integral obtained by integrating a concentration of n-dopants along a substantially vertical line between the first pn-junction and a point in the first n-type semiconductor region where a charge carrier life-time in the first n-type semiconductor region is at or close to a minimum value, wherein the concentration of n-dopants along the substantially vertical line comprises a local maximum which is at or close to the point in the first n-type semiconductor region where the charge carrier lifetime in the first n-type semiconductor region is at or close to the minimum value, wherein the local maximum is one of at least two local maxima of the concentration of n-dopants on a line comprising the substantially vertical line and extending to the second pn-junction.

12. The bipolar semiconductor switch of claim 11, wherein the integral is in a range from about 60%, to about 90, of the breakdown charge divided by the elementary charge.

13. The bipolar semiconductor switch of claim 11, wherein the charge carrier life-time at the point substantially corresponds to the minimum value.

14. A bipolar semiconductor switch, comprising a semiconductor body, the semiconductor body comprising:
   a first p-type semiconductor region;
   a second p-type semiconductor region; and
   a first n-type semiconductor region forming a first pn-junction with the first p-type semiconductor region and a second pn-junction with the second p-type semiconductor region;
   wherein, on a shortest path through the first n-type semiconductor region between the first pn-junction and the second pn-junction, a concentration of n dopants comprises at least two local maxima and a charge carrier life-time comprises a minimum which is located at or close to at least one of the at least two local maxima.

15. The bipolar semiconductor switch of claim 14, wherein the minimum is at least close to a second local maximum or a third local maximum of the at least two local maxima, the second local maximum being arranged between the second pn-junction and the third local maximum.

16. The bipolar semiconductor switch of claim 14, wherein the first n-type semiconductor region comprises a semiconductor material having a breakdown charge, and wherein a line integral of a concentration of n-dopants along the shortest path integrated between the first pn-junction and a point where the charge carrier life-time in the first n-type semiconductor region is substantially close to the minimum is smaller than the breakdown charge divided by the elementary charge.

* * * * *